(12) United States Patent
Lee et al.

(10) Patent No.: US 6,352,865 B2
(45) Date of Patent: Mar. 5, 2002

(54) METHOD FOR FABRICATING A CAPACITOR FOR A SEMICONDUCTOR DEVICE

(75) Inventors: Kee Jeung Lee, Seoul; Dong Jun Kim, Kyoungki-do, both of (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 37 days.

(21) Appl. No.: 09/742,221

(22) Filed: Dec. 22, 2000

(51) Int. Cl.[7] ................................................. H01G 7/06
(52) U.S. Cl. ........................................... 438/3; 438/240
(58) Field of Search ........................... 438/3, 240, 785

(56) References Cited

U.S. PATENT DOCUMENTS 5,192,871 A * 3/1993 Ramakrishnan et al. .... 257/595
6,180,482 B1 * 1/2001 Kang ........................ 438/396
6,204,203 B1 * 3/2001 Narwankar et al. ......... 438/785

\* cited by examiner

*Primary Examiner*—Jey Tsai
(74) *Attorney, Agent, or Firm*—Pillsbury Winthrop LLP

(57) ABSTRACT

The present invention discloses a method for fabricating a capacitor for a semiconductor device. The method includes the steps of: forming a lower electrode at the upper portion of a semiconductor substrate where a predetermined structure has been formed; forming an amorphous $(Ta_2O_5)_{1-x}$—$(TiO_2)_x$ film on the lower electrode; performing a thermal treatment on the amorphous $(Ta_2O_5)_{1-x}$—$(TiO_2)_x$ film; and forming an upper electrode on the amorphous $(Ta_2O_5)_{1-x}$—$(TiO_2)_x$ film. A capacitance for the operation of a high integration device is sufficiently obtained by using the $(Ta_2O_5)_{1-x}$—$(TiO_2)_x$ film having a high dielectric constant, thereby fabricating the capacitor suitable for the high integration semiconductor device.

20 Claims, 1 Drawing Sheet

METHOD FOR FABRICATING A CAPACITOR FOR A SEMICONDUCTOR DEVICE

BACKGROUND OF THE INVENTION

1. Field of the Invention

The present invention relates to a method for fabricating a capacitor for a semiconductor device, and more particularly, to a method for fabricating capacitors that exhibit both improved electrical properties and sufficient capacitance required for advanced semiconductor devices.

2. Description of the Background Art

Recently, the degree of integration of memory products has been increased through the application of improved semiconductor processing techniques for producing increasingly smaller device structures. Accordingly, the unit cell area has decreased remarkably and the use of lower operating voltages has increased. Despite the decrease in the size of the cell area, however, the capacitance required to operate memory devices without generating soft errors and reducing refresh times has remained on the order of 25 fF per cell. As a result, DRAM capacitor designs using a nitride-oxide (NO) structure as the dielectric film it has typically been necessary to utilize a three-dimensional electrode structure and/or a hemispherical grain surface (HSG) to obtain the necessary capacitance values. The three-dimensional electrode structures increase the effective surface area of the capacitors by increasing the height and vertical surface area of the electrode.

However, increasing the height of the capacitor electrode structures also complicates subsequent process steps, particularly with regard to photolithography and etch processes. As the height of the capacitor increases, the depth of focus and dimension control that can be obtained during subsequent photolithography processes may be insufficient to accurately reproduce the necessary patterns. This difficulty is the result of the height differences between cell regions and peripheral circuit regions, height differences that can adversely affect subsequent integration processes, particularly after interconnection processes and at increased degrees of integration.

It is difficult, therefore, to construct a DRAM capacitor using a conventional NO dielectric film that has sufficient capacitance to support DRAMs designs having 256M or more cells.

In order to overcome some of the disadvantages of the conventional dielectric materials, capacitors using a tantalum oxide film as the dielectric film have been developed. Tantalum oxide films, however, have a non-uniform and unstable stoichiometry that generates vacancy Ta atoms as a result of variations in the composition ratio between tantalum and oxide atoms in the thin film. Thus vacancy Ta atoms in the form of oxygen vacancies are always present in the tantalum oxide film because of its unstable chemical composition.

Although the number of oxygen vacancies within the tantalum oxide film may be varied somewhat depending on the actual composition and the bonding degrees of the incorporated elements, there is presently no technique or method that will completely eliminate the oxygen vacancies. As a result, a special oxidation process intended to more completely oxidize the tantalum atoms in the thin film is required to stabilize the stoichiometry and thereby prevent generating a leakage current. Additionally, the tantalum oxide film is highly reactive with both polysilicon (oxide film electrode) and titanium nitride (metal electrode), two materials commonly used to form the upper and lower electrodes of a capacitor. As a result, oxygen present in the tantalum oxide thin film may react with the electrode materials, thereby forming a low dielectric oxide layer at the interface and degrading the uniformity and electrical properties of the resulting capacitor.

In addition, during the formation of the tantalum oxide thin film, carbon (C), carbon compounds (such as $CH_4$ and $C_2H_4$) and water vapor ($H_2O$) are typically produced by the reaction between the organic tantalum source, frequently $Ta(OC_2H_5)_5$, other reaction gases such as $O_2$ or $N_2O$. These impurities can, in turn, be incorporated into the resulting tantalum oxide film. These impurities, as well as other ions, free radicals, and oxygen vacancies, will tend to increase the leakage current and degrade the dielectric properties of the resulting capacitor.

SUMMARY OF THE INVENTION

Accordingly, a primary object of the present invention is to provide a method for fabricating a semiconductor device that incorporates a dielectric film having excellent electrical properties.

Another object of the present invention is to provide a method for fabricating a capacitor for a semiconductor device that has sufficient capacitance for the operation of the high integration semiconductor device, by using a dielectric film having a high dielectric constant.

Still another object of the present invention is to provide a method for fabricating a capacitor for a semiconductor device that can reduce production costs by both decreasing the number of necessary unit process steps and reducing the overall unit processing time.

In order to achieve the above-described objects, the present invention provides a method for fabricating a capacitor for a semiconductor device comprising the steps of: forming a lower electrode at the upper portion of a semiconductor substrate where a predetermined structure has been formed; forming an amorphous $(Ta_2O_5)_{1-x}$—$(TiO_2)_x$ film on the lower electrode; and forming an upper electrode on the amorphous $(Ta_2O_5)_{1-x}$—$(TiO_2)_x$ film.

There is also provided a method for fabricating a capacitor for a semiconductor device, comprising the steps of: forming a lower electrode at the upper portion of a semiconductor substrate where a predetermined structure has been formed; forming an amorphous $(Ta_2O_5)_{1-x}$—$(TiO_2)_x$ film on the lower electrode; performing a thermal treatment on the amorphous $(Ta_2O_5)_{1-x}$—$(TiO_2)_x$ film; and forming an upper electrode on the amorphous $(Ta_2O_5)_{1-x}$—$(TiO_2)_x$ film.

In addition, there is provided a method for fabricating a capacitor for a semiconductor device, comprising the steps of: forming a lower electrode at the upper portion of a semiconductor substrate where a predetermined structure has been formed; forming a $(Ta_2O_5)_{1-x}$—$(TiO_2)_x$ dielectric film on the lower electrode; performing a thermal treatment on the $(Ta_2O_5)_{1-x}$—$(TiO_2)_x$ dielectric film; and forming an upper electrode on the $(Ta_2O_5)_{1-x}$—$(TiO_2)_x$ dielectric film.

The present invention will become better understood in light of the following detailed description and the accompanying figures. The figures are provided by way of illustration only and are not intended to limit the scope of the invention.

DETAILED DESCRIPTION OF THE PREFERRED EMBODIMENTS

A method for fabricating a capacitor for a semiconductor device in accordance with the present invention will now be described in detail and through reference to the accompanying figures.

Figure 1:
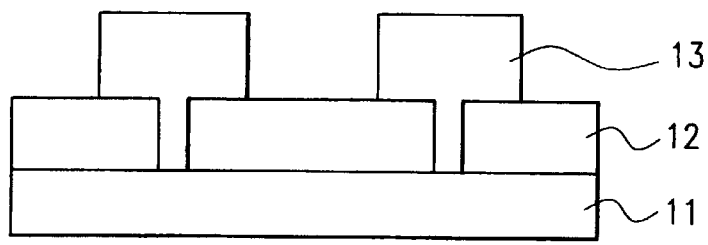
FIGS. 1 to 3 are cross-sectional views illustrating certain of the sequential steps in fabricating a capacitor for a semiconductor device in accordance with the present invention.

As shown in FIG. 1, an interlayer insulating film 12 is formed at the upper portion of a semiconductor substrate 11 where a gate (not shown), a source (not shown), a drain (not shown) and a bit line (not shown) have previously been formed. A contact opening (not shown) is then formed to expose a predetermined lower electrode contact region of the semiconductor substrate 11 by selectively removing a region of the interlayer insulating film 12. A first conductive film (not shown) is then formed on the upper portion of the interlayer insulating film 12 and in the contact opening. This first conductive film, preferably doped polysilicon, is then patterned and etched according to known photolithography and etch processes to form a lower electrode 13.

Figure 2:
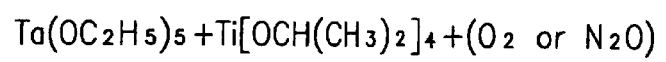
Figure 2:
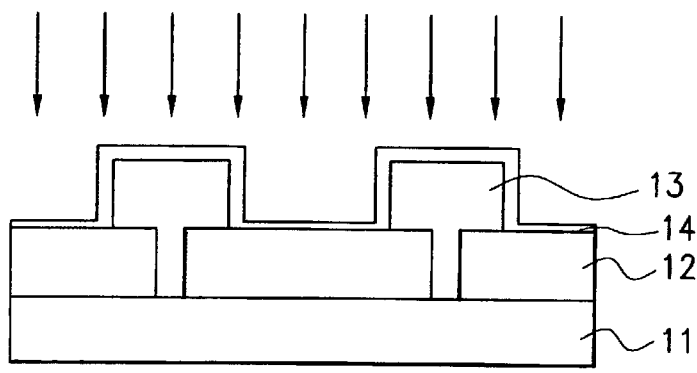

Referring to FIG. 2, a dielectric film is formed by depositing an amorphous $(Ta_2O_5)_{1-x}$—$(TiO_2)_x$ film 14 with $0<x\leq 0.5$ over the entire structure using a low pressure chemical vapor deposition (LPCVD) process. This LPCVD process preferably employs two organic metal compounds tantalum ethylate $(Ta(OC_2H_5)_5)$ and titanium isopropylate $(Ti[OCH(CH_3)_2]_4)$, as the metal sources for the $(Ta_2O_5)_{1-x}$—$(TiO_2)_x$ film. In order to remove any natural oxide film or other impurity present on the surface of the lower electrode 13, it is preferable to perform a wet cleaning process using a HF solution, or a dry cleaning process using a HF vapor either in-situ or ex-situ, before depositing the amorphous $(Ta_2O_5)_{1-x}$—$(TiO_2)_x$ film 14. In addition to the wet HF cleaning process. a solution of an addition compound such as $Na_4OH$ or $H_2SO_4$ may be used to improve uniformity.

The amorphous $(Ta_2O_5)_{1-x}$—$(TiO_2)_x$ film 14 is the product of a series of chemical reactions at or near the surface of the wafer in the LPCVD chamber at a temperature of between 300 and 600° C. The LPCVD deposition is continued until the $(Ta_2O_5)_{1-x}$—$(TiO_2)_x$ film 14 has reached a predetermined thickness, preferably less than 100 Å. The Ta chemical vapor is obtained by supplying an organic tantalum precursor compound, preferably a $Ta(OC_2H_5)_5$ solution, into an evaporator or evaporation tube at predetermined rate that is typically less than 300mg/minute. The evaporator or evaporation tube is generally maintained at a temperature typically between 150 and 250° C. and the feed rate is typically controlled with a mass flow controller (MFC). The evaporated solution is then fed into the LPCVD chamber. The Ti chemical vapor is obtained in a similar fashion by supplying one or more organic titanium precursor compounds, preferably $Ti[OCH(CH_3)_2]_4$, titanium tetrachloride $(TiCl_4)$, tetrakis-dimethylamido-Ti (TDMAT), or tetrakis-diethylamodo-Ti (TDEAT) to an evaporator or evaporation tube at a predetermined rate, typically less than 300 mg/minute. The evaporator or evaporation tube is preferably maintained at a temperature above 150° C., and more preferably, a temperature ranging between 200 and 300° C. The Ti chemical vapor is then fed, either in combination with the Ta chemical vapor or via separate inlets, into the LPCVD chamber.

In order to prevent condensation of the organic metal compound vapors, the complete supply path between the evaporator and the LPCVD chamber, including any orifice, nozzle, or supply tube should be maintained at a temperature of at least 150° C., and preferably a temperature between 150 and 300° C.

The Ta and Ti chemical vapors and an additional reaction gas then react in the LPCVD chamber to form the amorphous $(Ta_2O_5)_{1-x}$—$(TiO_2)_x$ film. The feed ratio of the Ta and Ti chemical vapors may be adjusted to obtain a Ti:Ta mole ratio between 0.01 and 1.0. With feed rates of both the Ta and Ti chemical vapors below 300 mg/minute, the reaction gas, typically $O_2$ or $N_2O$ gas, will generally be fed into the LPCVD chamber at a rate of between 5 and 500 sccm during formation of the amorphous $(Ta_2O_5)_{1-x}$—$(TiO_2)_x$ film 14. An excess of the reaction gas, either $O_2$ or $N_2O$, also serves to avoid both the formation of carbon impurities and the presence of vacancy Ta or Ti atoms in the thin film.

In addition, to improve a quality of the amorphous $(Ta_2O_5)_{1-x}$—$(TiO_2)_x$ film 14 and remove pin holes or micro cracks in the film, a low temperature thermal treatment may be carried out at a temperature below 600° C. in an atmosphere of $O_2$ or $N_2O$ with a flow rate of 5 to 500 sccm after the deposition of the amorphous $(Ta_2O_5)_{1-x}$—$(TiO_2)_x$ film 14.

On the other hand, in order to efficiently oxidize the minor amounts of vacancy Ta or Ti atoms and carbon impurities that remain in the thin film, and to enhance the bonding force, the low temperature thermal treatment is preferably performed by using UV—$O_3$, or $N_2O$ or $O_2$ plasma, at a temperature ranging from 300 to 600° C. after the deposition of the amorphous $(Ta_2O_5)_{1-x}$—$(TiO_2)_x$ film 14.

Figure 3:
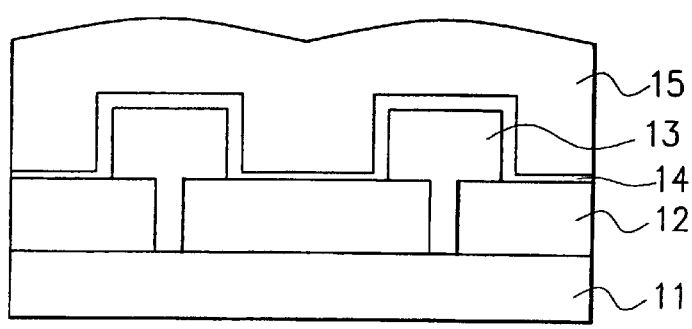

As shown in FIG. 3, a second conductive film 15 that will be used to form an upper electrode is formed over the entire structure. This second conductive film 15 may comprise a doped polysilicon film, a TiN film, or a metal substance selected from the group consisting of TaN, W, WN, WSi, Ru, $RuO_2$, Ir, $IrO_2$ and Pt. The upper electrode may also comprise a multilayer structure including both a TiN layer and a doped polysilicon layer.

As discussed earlier, the method for fabricating the capacitor for the semiconductor device in accordance with the present invention has the following advantages.

Utilizing the amorphous $(Ta_2O_5)_{1-x}$—$(TiO_2)_x$ film (with a dielectric constant $\in$ of between approximately 30 and 50) as the dielectric film for the capacitor provides a significantly higher dielectric constant than that available from a conventional NO film ($\in=4$~$5$). Further, the titanium oxide film, with its tetragonal system structure, is more stable than the conventional tantalum oxide film ($\in=25$~$27$) and is covalently bound in the structure of the amorphous $(Ta_2O_5)_{1-x}$—$(TiO_2)_x$ film, thereby providing enhanced mechanical and electrical strength. The capacitor of the present invention also exhibits improved resistance to electrostatic discharge (ESD) induced damage and thus provides superior electrical properties when compared with conventional capacitors. Moreover, the present invention prevents the oxygen vacancy and leakage current resulting from the unstable stoichiometry $(Ta_xO_y)$ and carbon impurities in the conventional capacitor relying on only a tantalum oxide film as the dielectric.

As a result, a capacitor constructed in accordance with the present invention provides a controlled dielectric that is equivalent to a oxide film of less than 20 Å. A capacitor according to the present invention thus provides a capacitance of over 25 fF per cell and improved electrical properties even at the level of integration necessary to support DRAMs of over 256M.

Therefore, the present invention does not require a complicated capacitor module having complex three-dimensional structures such as a step, cylinder, or fin electrode for increasing the effective electrode area. Especially, when the capacitor is fabricated using the amorphous $(Ta_2O_5)_{1-x}$—$(TiO_2)_x$ film as the dielectric film rather than the conventional tantalum oxide dielectric film, the ex-situ RTN process before the deposition of the tantalum oxide film, as well as the subsequent low temperature oxidation process and high temperature thermal treatment, may be eliminated. As a result, as compared with the conventional method, the number of unit processes is decreased and the corresponding unit processing time is reduced, thereby reducing production costs by as much as 30% or more.

Because the present invention may be practiced in several forms without departing from the spirit or essential characteristics thereof, it should also be understood that the invention is not, unless otherwise indicated, limited to the specific details of the foregoing descriptions. The present invention should be construed broadly within the spirit and scope as defined in the appended claims.

What is claimed is:

1. A method for fabricating a capacitor for a semiconductor device, comprising the steps of:
   forming a lower electrode on a predetermined location of a semiconductor substrate;
   forming an amorphous $(Ta_2O_5)_{1-x}$—$(TiO_2)_x$ film on the lower electrode, the value of x being less than 0.5; and
   forming an upper electrode on the amorphous $(Ta_2O_5)_{1-x}$—$(TiO_2)_x$ film.

2. The method according to claim 1, wherein the lower electrode further comprises a layer of doped polysilicon.

3. The method according to claim 1, further comprising the step of performing a wet cleaning process, the wet cleaning process comprising use of a HF acid solution, wherein the wet cleaning process is completed before the step of forming the amorphous $(Ta_2O_5)_{1-x}$—$(TiO_2)_x$ film.

4. The method according to claim 3, the wet cleaning process further comprising use of a $Na_4OH$ or $H_2SO_4$ solution.

5. The method according to claim 1, further comprising the step of performing a dry cleaning process, the dry cleaning process comprising use of a HF vapor, the step of performing the dry cleaning process being completed before the step of forming the amorphous $(Ta_2O_5)_{1-x}$—$(TiO_2)_x$ film.

6. The method according to claim 5, further comprising the step of performing a wet cleaning process, the wet cleaning process comprising use of a $Na_4OH$ or $H_2SO_4$ solution, the step of performing the wet cleaning process being performed after the step of performing the dry cleaning process.

7. The method according to claim 1, wherein the amorphous $(Ta_2O_5)_{1-x}$—$(TiO_2)_x$ film is formed by using a Ta chemical vapor and a Ti chemical vapor.

8. The method according to claim 1, wherein the amorphous $(Ta_2O_5)_{1-x}$—$(TiO_2)_x$ film has a thickness of between 10 and 100 Å.

9. The method according to claim 1, wherein the amorphous $(Ta_2O_5)_{1-x}$—$(TiO_2)_x$ film is formed by injecting the Ta chemical vapor, Ti chemical vapor, and $O_2$ or $N_2O$ gas into a low pressure chemical vapor deposition (LPCVD) chamber of 300 to 600° C.

10. The method according to claim 7, wherein the Ti chemical vapor is obtained by feeding $Ti[OCH(CH_3)_2]_4$ into an evaporator at a rate of less than 300 mg/minute, the evaporator maintaining a temperature of between 200 and 300° C.

11. The method according to claim 7, wherein the Ti chemical vapor is obtained by feeding titanium tetrachloride, tetrakis-dimethylamido-Ti or tetrakis-diethylamodo-Ti into an evaporator at a rate of less than 300 mg/minute, the evaporator being maintaining at a temperature of at least 150° C.

12. The method according to claim 7, wherein the Ta chemical vapor and the Ti chemical vapor are fed into the LPCVD chamber in amounts sufficient to produce a mole ratio of Ti:Ta of between 0.01 and 1.0.

13. The method according to claim 1, further comprising the step of performing a low temperature thermal treatment by using $O_2$ or $N_2O$, UV—$O_3$, or $N_2O$ or $O_2$ plasma at a temperature ranging from 300 to 600° C., wherein the step of performing a low temperature thermal anneal is performed after the step of depositing the amorphous $(Ta_2O_5)_{1-x}$—$(TiO_2)_x$ film.

14. The method according to claim 1, wherein the upper electrode comprises a doped polysilicon film, a TiN film or a metal substance.

15. The method according to claim 14, wherein the metal substance is selected from the group consisting of TaN, W, WN, WSi, Ru, $RuO_2$, Ir, $IrO_2$ and Pt.

16. The method according to claim 1, wherein the upper electrode has a stacked structure comprising a TiN layer and a doped polysilicon layer.

17. A method for fabricating a capacitor for a semicondustor device, comprising the steps of:
   forming a lower electrode at the upper portion of a semiconductor substrate where a predetermined structure has been formed;
   forming an amorphous $(Ta_2O_5)_{1-x}$—$(TiO_2)_x$ film on the lower electrode, wherein $0.02 \leq x \leq 0.5$;
   performing a thermal treatment on the amorphous $(Ta_2O_5)_{1-x}$—$(TiO_2)_x$ film; and
   forming an upper electrode on the amorphous $(Ta_2O_5)_{1-x}$—$(TiO_2)_x$ film.

18. The method according to claim 17, wherein the thermal treatment is performed in an $O_2$ or $N_2O$, or UV—$O_3$ or $O_3$ atmosphere by using $N_2O$ or $O_2$ plasma at a temperature ranging from 300 to 600° C.

19. A method for fabricating a capacitor for a semiconductor device, comprising the steps of:
   forming a lower electrode at the upper portion of a semiconductor substrate where a predetermined structure has been formed;
   forming a $(Ta_2O_5)_{1-x}$—$(TiO_2)_x$ dielectric film on the lower electrode, wherein $0.02 \leq x \leq 0.5$;
   performing a thermal treatment on the $(Ta_2O_5)_{1-x}$—$(TiO_2)_x$ dielectric film; and
   forming an upper electrode on the $(Ta_2O_5)_{1-x}$—$(TiO_2)_x$ dielectric film.

20. The method according to claim 19, wherein the thermal treatment is performed in an $O_2$ or $N_2O$, or UV—$O_3$ or $O_3$ atmosphere by using $N_2O$ or $O_2$ plasma at a temperature ranging from 300 to 600° C.

* * * * *